(12) United States Patent
Harada et al.

(10) Patent No.: US 8,389,421 B2
(45) Date of Patent: Mar. 5, 2013

(54) FILM FORMATION METHOD AND FILM FORMATION APPARATUS

(75) Inventors: Katsushige Harada, Nirasaki (JP); Yuichiro Morozumi, Nirasaki (JP); Shingo Hishiya, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/115,601

(22) Filed: May 25, 2011

(65) Prior Publication Data

US 2011/0300719 A1 Dec. 8, 2011

(30) Foreign Application Priority Data

May 28, 2010 (JP) .................................. 2010-122478
Apr. 18, 2011 (JP) .................................. 2011-092088

(51) Int. Cl.
*H01L 21/316* (2006.01)
(52) U.S. Cl. ................................ 438/784; 257/E21.271
(58) Field of Classification Search .................. None
See application file for complete search history.

(56) References Cited

U.S. PATENT DOCUMENTS

| 5,801,105 A | * | 9/1998 | Yano et al. ..................... 438/785 |
| 2005/0181930 A1 | * | 8/2005 | Roziere et al. .................. 502/60 |
| 2006/0251884 A1 | * | 11/2006 | Naito et al. .................... 428/331 |
| 2009/0085160 A1 | * | 4/2009 | Lee et al. ...................... 257/532 |

FOREIGN PATENT DOCUMENTS

| JP | 2001-152339 | 6/2001 |
| JP | 2006-310754 | 11/2006 |
| JP | 2010-067958 | 3/2010 |

* cited by examiner

*Primary Examiner* — Seahvosh Nikmanesh
(74) *Attorney, Agent, or Firm* — Cantor Colburn LLP

(57) ABSTRACT

When an object to be processed is transferred into a process chamber capable of keeping a vacuum and an interior of the process chamber is kept in a vacuum state, the film formation method includes performing forming a first ZrO film on the object to be processed by supplying a zirconium material and an oxidizing agent in the order listed above into the process chamber and forming a second ZrO film doped with Si on the object to be processed by supplying the zirconium material, a silicon material, and the oxidizing agent in the order listed above into the process chamber, in such a way that a number of times the forming the first ZrO film is performed and a number of times the forming the second ZrO film is performed are adjusted, respectively, to form a zirconia-based film having a predetermined film thickness while controlling a Si concentration in the film.

8 Claims, 6 Drawing Sheets

FIG. 3

| STEP | FIRST PROCESS (ZrO) | | | | SECOND PROCESS (ZrSiO) | | | | | |
|---|---|---|---|---|---|---|---|---|---|---|
| | S1 | S2 | S3 | S4 | S11 | S12 | S13 | S14 | S15 | S16 |
| PROCESS | Zr SOURCE ADSORPTION | PURGE | OXIDIZING AGENT SUPPLY | PURGE | Zr SOURCE ADSORPTION | PURGE | Si SOURCE ADSORPTION | PURGE | OXIDIZING AGENT SUPPLY | PURGE |
| PERIOD | T1 | T2 | T3 | T4 | T11 | T12 | T13 | T14 | T15 | T16 |

←—— X TIMES ——→ ←—————— Y TIMES ——————→

FILM FORMATION METHOD AND FILM FORMATION APPARATUS

CROSS-REFERENCE TO RELATED PATENT APPLICATIONS

This application claims the benefits of Japanese Patent Application No. 2010-122478, filed on May 28, 2010 and Japanese Patent Application No. 2011-092088, filed on Apr. 18, 2011 in the Japan Patent Office, the disclosures of which are incorporated herein in its entirety by reference.

BACKGROUND OF THE INVENTION

1. Field of the Invention

The present invention relates to a film formation method and a film formation apparatus for forming a zirconia-based film on a substrate to be processed, such as a semiconductor wafer or the like.

2. Description of the Related Art

Recently, as an LSI is required to be more highly integrated and operate faster, a design rule for a semiconductor device constituting the LSI is more complicated. Accordingly, a dielectric film is required to have a higher capacity, and to have a lower EOT (Equivalent Oxide Thickness), which refers to a thickness of a dielectric film scaled by a ratio of a dielectric constant of the dielectric film to a dielectric constant of $SiO_2$, and a higher dielectric constant. In order to have a higher dielectric constant, a dielectric film needs to be crystallized. Furthermore, a film is required to have a higher crystallinity. Also, according to each of devices, since there is a limitation of thermal budget, a film is required to be formed or crystallized at a low temperature.

As a high dielectric constant material meeting these requirements, a zirconium oxide ($ZrO_2$) film is examined (for example, in Patent Reference 1). Also, as a method of forming a zirconium oxide film at a low temperature, an ALD process that uses, for example, tetrakis(ethylmethylamino)zirconium (TEMAZ) as a material gas (precursor) and for example, an $O_3$ gas as an oxidizing agent, and alternately supplies the material gas and the oxidizing agent is known (for example, in Patent Reference 2). Since zirconium oxide is easily crystallized, zirconium oxide may be crystallized without adversely affecting a device by being formed at a low temperature in such a method or then being annealed at a temperature of 450° C. or lower.

However, although such a dielectric film is required to have a high dielectric constant and a small leakage current, once the dielectric film is crystallized as described above, a leakage current is increased due to a crystal grain boundary leakage in which current leaks from a crystal grain boundary.

In order to solve the problem, there is suggested in Patent Reference 3 a method including a process of forming a $ZrO_2$ film on a substrate by alternately supplying a zirconium material and an oxidizing agent into a process chamber for a plurality of times and a process of forming a $SiO_2$ film on the substrate by alternately supplying a silicon material and an oxidizing agent once or for a plurality of times. According to the method, the processes are performed by adjusting the number of times the materials and the oxidizing agent are supplied, such that a Si concentration in the film ranges from 1 to 4 atm %, the $ZrO_2$ film formation and the $SiO_2$ film formation based on the adjusted number of times are treated as a single cycle, and the cycle is performed once or for a plurality of times to form a zirconia-based film having a predetermined film thickness. Accordingly, since a grain boundary leakage is suppressed with maintaining a zirconia crystal, the method can achieve a small leakage current with maintaining a high dielectric constant equal to that of a $ZrO_2$ single film.

3. Prior Art Reference (Patent Reference 1) Japanese Patent Laid-Open Publication No. 2001-152339

(Patent Reference 2) Japanese Patent Laid-Open Publication No. 2006-310754

(Patent Reference 3) Japanese Patent Laid-Open Publication No. 2010-067958

SUMMARY OF THE INVENTION

Since a technology of Patent Reference 3 can obtain a high dielectric constant equal to that of a $ZrO_2$ single film, obtain an EOT equal to that of a $ZrO_2$ single film, and achieve a small leakage current, the technology of Patent Reference 3 is examined to be applied to a capacitor film of a DRAM.

However, it has been found that when the technology of Patent Reference 3 is used to form a film on a recessed and protruded portion, such as a capacitor film of a DRAM, dielectric characteristics and leakage current characteristics are deteriorated.

A technical goal of the present invention is to provide a film formation method and a film formation apparatus that can certainly form a zirconia-based film having a small leakage current and a high dielectric constant even on a recessed and protruded portion.

After conducting a study in order to solve the problems, the present inventors have found that when a $ZrO_2$ film containing Si is formed on a recessed and protruded portion, such as a capacitor film of a DRAM, as disclosed in Patent Reference 3, since step coverage functions of $SiO_2$ and $ZrO_2$ are different from each other, a Si concentration in a film in a recessed portion of the recessed and protruded portion is higher than that in a flat portion and thus the Si concentration in the recessed portion exceeds a predetermined concentration, thereby reducing a dielectric constant and deteriorating leakage current characteristics. And, the present inventors have found that in order to prevent the dielectric constant from being reduced and the leakage current characteristics from being deteriorated as the Si concentration in the recessed portion is increased, it is effective to employ a film formation method that can certainly reduce a Si concentration.

Based on the found results, according to an embodiment of the present invention, there is provided a film formation method wherein an object to be processed is transferred into a process chamber capable of keeping a vacuum and an interior of the process chamber is kept in a vacuum state, and forming a first ZrO film on the object to be processed by supplying a zirconium material and an oxidizing agent in the order listed above into the process chamber and forming a second ZrO film doped with Si on the object to be processed by supplying the zirconium material, a silicon material and the oxidizing agent in the order listed above into the process chamber are performed in such a way that a number of times the forming the first ZrO film is performed and a number of times the forming the second ZrO film is performed are adjusted, respectively, to form a zirconia-based film having a predetermined film thickness while controlling a Si concentration in the film.

Also, according to another embodiment of the present invention, there is provided a film formation apparatus for forming a metal oxide film on an object to be processed, the film formation apparatus including: a process chamber which has a vertical and cylindrical shape and is capable of keeping a vacuum; a holding member which holds objects to be processed in the process chamber with holding the objects to be processed in a multistage manner; a heater which is installed to surround an outer circumference of the process chamber; a zirconium material supply unit which supplies a zirconium material into the process chamber; a silicon material supply unit which supplies a silicon material into the process chamber; an oxidizing agent supply unit which supplies an oxidizing agent into the process chamber; and a controller which controls the zirconium material supply unit, the silicon material supply unit, and the oxidizing agent supply unit, wherein the controller controls a zirconia-based film to be formed with a predetermined film thickness while controlling a Si concentration in the film by transferring the object to be processed into the process chamber capable of keeping vacuum and keeping an interior of the process chamber in a vacuum state, and by performing forming a first ZrO film on the object to be processed by supplying the zirconium material and the oxidizing agent in the order listed above into the process chamber and forming a second ZrO film doped with Si on the object to be processed by supplying the zirconium material, a silicon material and the oxidizing agent in the order listed above into the process chamber in such a way that a number of times the forming the first ZrO film is performed and a number of times the forming the second ZrO film is performed are adjusted, respectively.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 3 is a chart for explaining a film formation method according to an embodiment of the present invention;

DETAILED DESCRIPTION OF THE INVENTION

Figure 1:
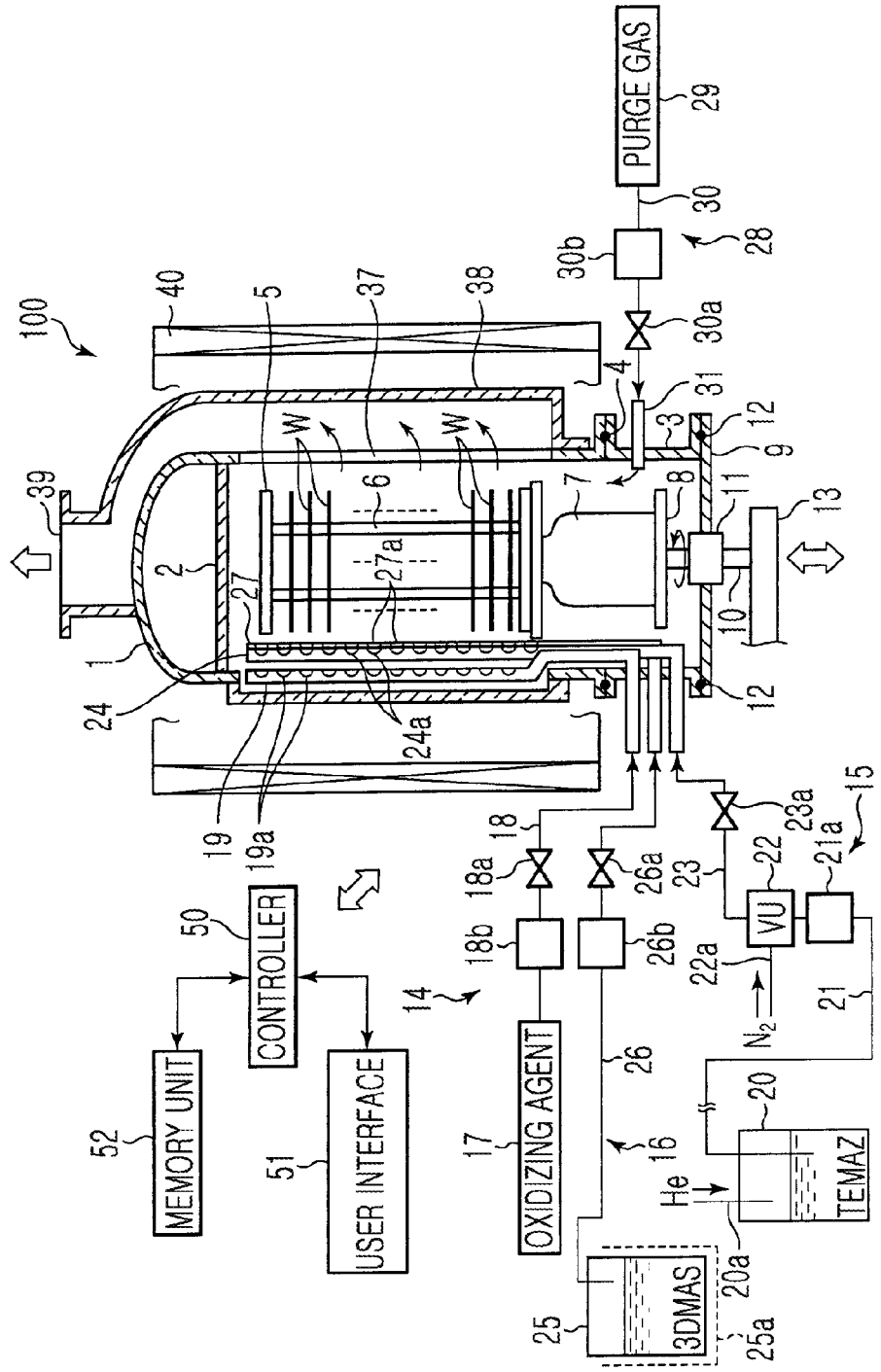
FIG. 1 is a longitudinal-sectional view showing an example of a film formation apparatus for performing a film formation method according to an embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
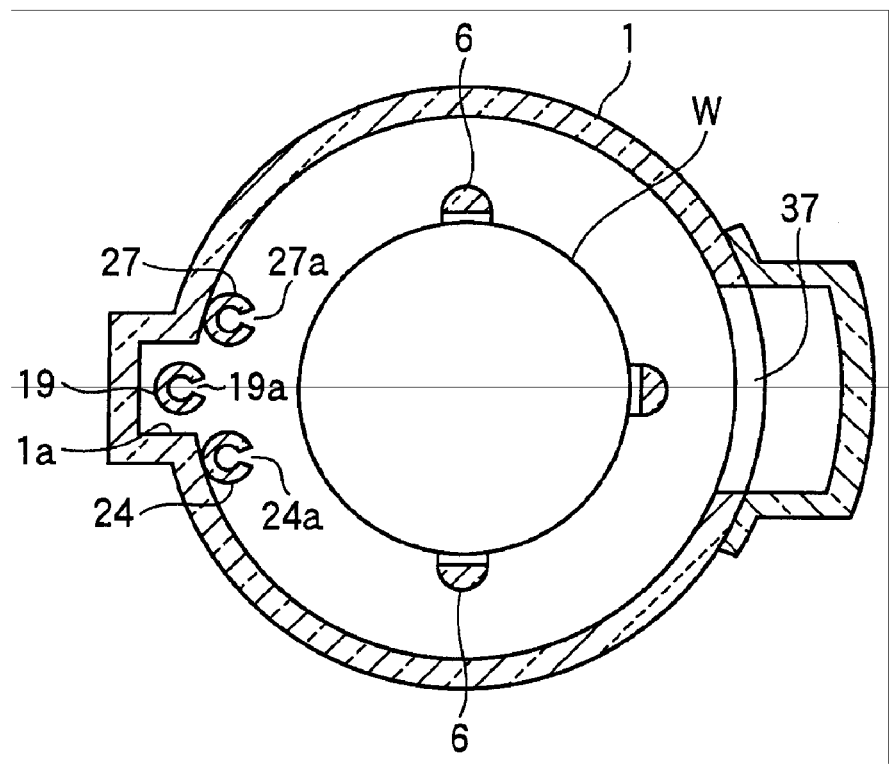
FIG. 2 is a cross-sectional view showing the example of the film formation apparatus for performing the film formation method according to an embodiment of the present invention.

FIG. 1 is a longitudinal-sectional view showing an example of a film formation apparatus for performing a film formation method according to an embodiment of the present invention. FIG. 2 is a cross-sectional view showing the film formation apparatus of FIG. 1. FIG. 3 is a chart for explaining a film formation method according to an embodiment of the present invention. Also, in FIG. 2, a heater is not shown.

A film formation apparatus 100 includes a process chamber 1 having a shape of a bottom-open cylinder with a ceiling. The process chamber 1 is entirely formed of, for example, quartz, and a quartz ceiling plate 2 is installed on the ceiling in the process chamber 1 so that the process chamber 1 is sealed. Also, a manifold 3 formed of, for example, stainless steel, and having a cylindrical shape is connected to an opening of bottom of the process chamber 1 with a sealing member 4, such as an O-ring, therebetween.

The manifold 3 supports the bottom of the process chamber 1. A quartz wafer boat 5, on which a plurality of, for example, 50 to 100, semiconductor wafers (hereinafter, simply referred to as wafers W) as objects to be processed can be held in multiple layers, may be inserted from below the manifold 3 into the process chamber 1. The wafer boat 5 includes three pillars 6 (see FIG. 2), and the plurality of wafers W are supported on grooves provided on the pillars 6.

The wafer boat 5 is disposed on a table 8 via a quartz thermos vessel 7. The table 8 is supported by a rotation shaft 10, which penetrates, for example, a stainless steel cover 9 for opening and closing the bottom opening of the manifold 3.

And a magnetic fluid seal 11, for example, is provided on a portion of the rotation shaft 10 penetrating the cover 9 so as to tightly seal the rotation shaft 10 and to rotatably support the rotation shaft 10. Furthermore, a sealing member 12, for example, an O-ring, is installed between the peripheral portion of the cover 9 and the bottom of the manifold 3. Accordingly, sealing of the process chamber 1 is held.

The rotation shaft 10 is attached to a leading end of an arm 13 supported by an elevating unit (not shown), for example, a boat elevator or the like, and collectively moves up the wafer boat 5, the cover 9 or the like to be inserted into or to be pulled out from the process chamber 1. Also, the table 8 may be fixedly installed on the cover 9, so that the wafers W may be processed without rotating the wafer boat 5.

The film formation apparatus 100 includes an oxidizing agent supply unit 14 for supplying an oxidizing agent in a gaseous state, for example, an $O_3$ gas, into the process chamber 1, a Zr source gas supply unit 15 for supplying a Zr source gas (zirconium material) into the process chamber 1, and a Si source gas supply unit 16 for supplying a Si source gas (silicon material) into the process chamber 1. Also, the film formation apparatus 100 includes a purge gas supply unit 28 for supplying an inert gas, for example, a $N_2$ gas, as a purge gas into the process chamber 1.

The oxidizing agent supply unit 14 includes an oxidizing agent supply source 17, an oxidizing agent pipe 18 for guiding an oxidizing agent from the oxidizing agent supply source 17, and an oxidizing agent distribution nozzle 19 connected to the oxidizing agent pipe 18 and including a quartz pipe that penetrates a sidewall of the manifold 3, is bent upward, and vertically extends. A plurality of gas ejecting holes 19a are provided at predetermined intervals in a vertical portion of the oxidizing agent distribution nozzle 19, and the oxidizing agent, for example, an $O_3$ gas, is substantially uniformly ejected toward the process chamber 1 horizontally from the gas ejecting holes 19a. Instead of an $O_3$ gas, a $H_2O$ gas, an $O_2$ gas, a $NO_2$ gas, a NO gas, a $N_2O$ gas, or the like may be used as the oxidizing agent. Reactivity may be improved by installing a plasma generator and plasmatizing the oxidizing agent. Also, radical oxidation using an $O_2$ gas and a $H_2$ gas may be performed. If an $O_3$ gas is used, an ozonizer that generates an $O_3$ gas may be provided as the oxidizing agent supply source 17.

The Zr source gas supply unit 15 includes a Zr source chamber 20 containing a Zr source in a liquid state, for example, tetrakis(ethylmethylamino)zirconium (TEMAZ), a Zr source pipe 21 for guiding the liquid Zr source from the Zr source chamber 20, an evaporator 22 connected to the Zr source pipe 21 and adapted to evaporate the Zr source, a Zr source gas pipe 23 for guiding a Zr source gas generated by the evaporator 22, and a Zr source gas distribution nozzle 24 connected to the Zr source gas pipe 23 and including a quartz pipe that penetrates the sidewall of the manifold 3, is bent upward, and vertically extends. A carrier gas pipe 22a for supplying a $N_2$ gas as a carrier gas is connected to the evaporator 22. A plurality of gas ejecting holes 24a are provided in the Zr source gas distribution nozzle 24 at predetermined intervals along a longitudinal direction of the Zr source gas distribution nozzle 24, and the Zr source gas is substantially uniformly ejected into the process chamber 1 horizontally from each of the gas ejecting holes 24a.

The Si source gas supply unit 16 includes a Si source chamber 25 containing a Si source in a liquid state, for example, tri(dimethylamino)silane (3DMAS), a heater 25a installed around the Si source chamber 25 and adapted to evaporate the Si source in the liquid state, a Si source gas pipe 26 for guiding a Si source gas evaporated in the Si source chamber 25, and a Si source gas distribution nozzle 27 connected to the Si source gas pipe 26 and installed to penetrate the sidewall of the manifold 3. A plurality of gas ejecting holes 27a are provided in the Si source gas distribution nozzle 27 at predetermined intervals along a longitudinal direction of the Si source gas distribution nozzle 27, and the Si source gas is substantially uniformly ejected into the process chamber 1 horizontally from each of the gas ejecting holes 27a.

Also, the purge gas supply unit 28 includes a purge gas supply source 29, a purge gas pipe 30 for guiding a purge gas from the purge gas supply source 29, and a purge gas nozzle 31 connected to the purge gas pipe 30 and installed to penetrate the sidewall of the manifold 3. An inert gas, for example, a $N_2$ gas, may be appropriately used as the purge gas.

An opening/closing valve 18a and a flow controller 18b, such as a mass flow controller, are installed in the oxidizing agent pipe 18 to supply the oxidizing agent in the gaseous state at a controlled flow rate. Also, an opening/closing valve 26a and a flow controller 26b, such as a mass flow controller, are installed in the Si source gas pipe 26 to supply the Si source gas at a controlled flow rate. Also, an opening/closing valve 30a and a flow controller 30b, such as a mass flow controller, are installed in the purge gas pipe 30 to supply the purge gas at a controlled flow rate.

A Zr source carrier pipe 20a is inserted into the Zr source chamber 20, and supplies a carrier gas, such as a He gas or the like to supply the liquid Zr source to the Zr source pipe 21. A flow controller 21a, such as a liquid mass flow controller, is installed in the Zr source pipe 21, and an opening/closing valve 23a is installed in the Zr source gas pipe 23.

The Zr source is not limited to a special source, and may be any of various sources that can be adsorbed as $ZrO_2$. An organic metal compound that is liquid at room temperature, for representative example, TEMAZ, may be appropriately used as the Zr source. Also, besides TEMAZ, as an organic metal compound that is liquid at room temperature, tetrakis (diethylamino)zirconium (TDEAZ) or cyclopentadienyltris (dimethylamino)zirconium (MCPDTMZ) may be used. Of course, an organic metal compound that is solid at room temperature may also be used, but in this case, a mechanism for evaporating a material, a mechanism for heating a pipe or the like is needed. Also, an inorganic compound may be used.

The Si source is also not limited to a special source, and may be any of sources that can be adsorbed. In addition to 3DMAS, as described above, an organic compound, such as tetra(dimethylamino)silane (4DMAS), bis(tertiary butylamino)silane (BTBAS), or the like, may be used. Also, an inorganic compound such as dichlorosilane (DCS), hexachlorodisilane (HCD), monosilane ($SiH_4$), disilane ($Si_2H_6$), tetrachlorosilane (TCS), or the like, may be used.

The oxidizing agent distribution nozzle 19 for distributing and ejecting the oxidizing agent is installed in a recessed portion 1a of the process chamber 1, and the Zr source gas distribution nozzle 24 and the Si source gas distribution nozzle 27 are installed with the oxidizing agent distribution nozzle 19 interposed therebetween.

An exhaust port 37 for evacuating a gas inside the process chamber 1 to create a vacuum is installed at a portion opposite to the oxidizing agent distribution nozzle 19 and the Zr source gas distribution nozzle 24 of the process chamber 1. The exhaust port 37 is narrowly and longitudinally provided by vertically cutting off a portion of a sidewall of the process chamber 1. An exhaust port cover 38 having a U-shaped cross-section and provided to cover the exhaust port 37 is welded to a portion corresponding to the exhaust port 37 of the process chamber 1. The exhaust port cover 38 upwardly extends along the sidewall of the process chamber 1 to define a gas outlet 39 above the process chamber 1. And, vacuum suction is performed from the gas outlet 39 by using a vacuum exhauster including a vacuum pump (not shown) and the like. And, a heater 40 having a cylindrical shape and adapted to heat the process chamber 1 and the wafers W inside the process chamber 1 is installed to surround an outer circumference of the process chamber 1.

Each element of the film formation apparatus 100 is controlled by a controller 50 including, for example, a microprocessor (computer). For example, the controller 50 controls supply or cutting off of each gas by opening or closing the opening/closing valves 18a, 23a, 26a, and 30a, controls a flow rate of a gas or a liquid source by using the flow controllers 18b, 21a, 26b, and 30b, switches a gas introduced to the process chamber 1, and controls the heater 40. A user interface 51 including a keyboard by which a command is input in order for an operator to manage the film formation apparatus 100, a display that visibly displays an operation state of the film formation apparatus 100, or the like is connected to the controller 50.

Also, a memory unit 52 contains a control program for accomplishing various processes executed in the film formation apparatus 100 under the control of the controller 50, or a program, that is, a recipe, for executing a process in each element of the film formation apparatus 100 according to process conditions, and is connected to the controller 50. The recipe is stored in a storage medium in the memory unit 52. The storage medium may be a fixed medium, such as a hard disk or the like, or a portable type medium, such as a CDROM, a DVD, a flash memory, or the like. Also, the recipe may be appropriately transmitted from another device via, for example, a dedicated line.

And, if necessary, by invoking an arbitrary recipe in response to an instruction or the like from the user interface 51 from the memory unit 52 and executing the recipe in the controller 50, a desired process is performed in the film formation apparatus 100 under the control of the controller 50. That is, since a program (that is, a process recipe) for executing a following film formation method is stored in the storage medium of the memory unit 52, the controller 50 controls the film formation apparatus 100 to perform the following film formation method according to the program.

Next, a film formation method according to an embodiment of the present invention performed by using the film formation apparatus 100 constructed as described above will be explained with reference to FIG. 3.

First, at room temperature, the wafer boat 5 on which, for example, 50 to 100 wafers W are held as objects to be processed, is loaded by moving up from the bottom of the process chamber 1, which is previously controlled to a predetermined temperature, and the opening of the bottom of the manifold 3 is closed by the cover 9, to seal the interior of the process chamber 1. The wafers W, for example, have diameters of 300 mm.

And, vacuum suction is performed in the process chamber 1 such that the process chamber 1 is maintained in a predetermined process pressure, power supply to the heater 40 is controlled, temperatures of the wafers are increased to the process temperature and are maintained at the process temperature, and then film formation is started in a state where the wafer boat 5 is rotated. The process temperature preferably ranges from 200 to 300° C. and may be, for example, 210° C.

The film formation at this time includes, as shown in FIG. 3, a first process for forming a ZrO film and a second process for forming a ZrO film (ZrSiO film) doped with Si, wherein the first process is performed x times and the second process is performed y times. The first process includes a step S1 of supplying a Zr source gas into the process chamber 1 to be adsorbed onto the wafers W, a step S2 of performing vacuum suction inside the process chamber 1 and performing purging with a purge gas, a step S3 of supplying an oxidizing agent in a gaseous state, for example, an $O_3$ gas, into the process chamber 1 to oxidize the Zr source gas, and a step S4 of performing vacuum suction inside the process chamber 1 and performing purging with the purge gas. Also, the second process includes a step S11 of supplying the Zr source gas into the process chamber 1 to be adsorbed onto the wafers W, a step S12 of performing vacuum suction inside the process chamber 1 and performing purging with the purge gas, a step S13 of supplying a Si source gas into the process chamber 1 to be adsorbed onto the Zr source gas adsorbed on the wafers W, a step S14 of performing vacuum suction inside the process chamber 1 and performing purging with the purge gas, a step S15 of supplying the oxidizing agent in the gaseous state, for example, an $O_3$ gas, into the process chamber 1 to oxidize the Zr source gas and the Si source gas to form a ZrO film doped with Si, and a step S16 of performing vacuum suction inside the process chamber 1 and performing purging with the purge gas.

A zirconia-based film having a desired thickness and including a desired Si concentration may be formed by adjusting a number of times x the first process is performed and a number of times y the second process is performed. That is, since a Si concentration in a film is almost proportional to a proportion of the number of times y the second process is performed, that is, y/(x+y), x and y may be determined to obtain a desired Si concentration by previously obtaining a relationship between y/(x+y) and a Si concentration.

In this case, since Si may not be contained in the first process and an amount of adsorbed Si be reduced by adsorbing a zirconium material and then a silicon material in the second process, a Si concentration in a film can be reduced greatly by adjusting the number of times the first process is processed and the number of times the second process is performed.

Figure 4:
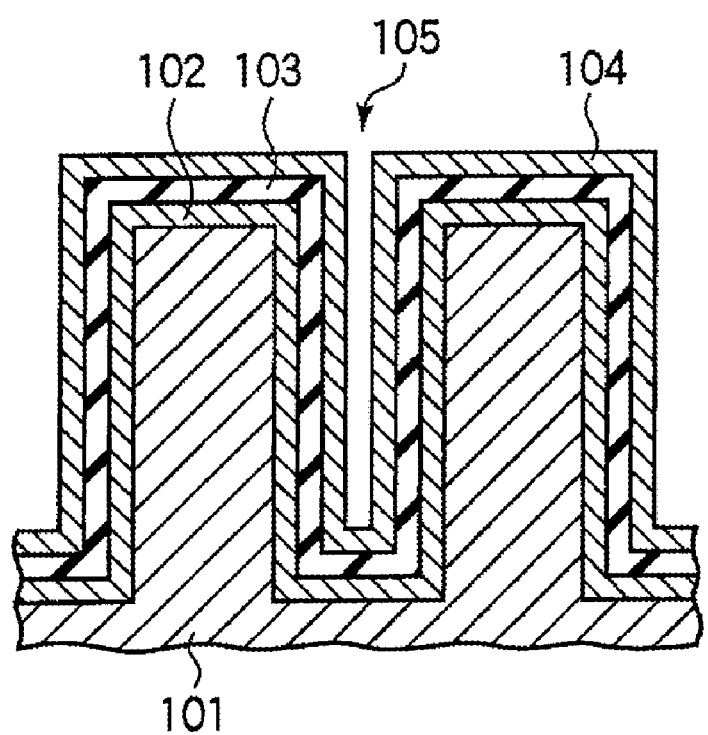
FIG. 4 is a cross-sectional view showing a structure of a capacitor of a DRAM to which the present invention is applied.

In a capacitor of a DRAM as shown in FIG. 4, a dielectric film 103 is formed on a lower electrode 101 having recessed and protruded portions by using a TiN film 102, which is a part of the lower electrode 101, therebetween and an upper electrode 104 is formed on the dielectric film 103. However, when a zirconia-based film doped with Si is formed on the lower electrode 101 having the recessed and protruded portions by using a method disclosed in Patent Reference 3 with using a Zr material and a Si material, since step coverage of the Zr material and the Si material are different from each other, an amount of Si adsorbed onto a recessed portion 105 is relatively increased and thus a Si concentration is locally increased in the recessed portion 105, thereby reducing a dielectric constant and deteriorating leakage current characteristics.

On the contrary, when a zirconia-based film doped with Si is formed by using the method of the present embodiment, since a Si concentration is reduced greatly, even though a Si concentration is locally increased in the recessed portion 105, a dielectric constant can be prevented from being reduced and leakage current characteristics can be prevented from being deteriorated. Accordingly, a zirconia-based film, which can maintain a crystallinity of $ZrO_2$, can be formed even on a recessed and protruded portion, such as a capacitor of a DRAM, without reducing a dielectric constant and deteriorating leakage current characteristics.

According to a result of an experiment conducted by the present inventors, it is found that in a flat capacitor (flat film), a dielectric constant is reduced when a Si concentration is equal to or higher than about 3.0 atm % and leakage current characteristics are deteriorated when a Si concentration is equal to or higher than about 5.0 atm %. Since it is known that a Si concentration under a trench is about 3 times higher than that on a flat capacitor when a Si concentration on the flat capacitor is controlled to value, it is preferable that a Si concentration on the flat capacitor (flat film) is equal to or lower than 1.0 atm %. Also, although a Si concentration can be reduced to be close to 0 by reducing the proportion of the number of times y the second process is performed in the present embodiment, it is preferable that a Si concentration is equal to or higher than 0.02 atm % in order to achieve sufficient uniformity of Si and an sufficient effect of Si.

Since a small amount of Si is doped, the proportion of the number of times y the second process is performed is very low. For example, if the number of times x is 51 and the number of times y is 2, Si can be doped to a concentration of 0.04 atm %. Accordingly, Si can be doped with high uniformity by regularly performing the second process between the first processes that are repeatedly performed. (For example, when a cycle defined by repeatedly performing the first process 17 times and then performing the second process once is repeatedly performed 2 times, and then the first process is additionally repeatedly performed 17 times.)

In order to more uniformly dope Si, it is preferable that a formed film is annealed. In this case, it is preferable that an annealing temperature is equal to or lower than 450° C. If the annealing temperature exceeds 450° C., a device may be adversely affected.

Next, the first process and the second process will be explained in detail.

In the step S1 of the first process, a Zr source, for example, TEMAZ, is supplied from the Zr source chamber 20 of the Zr source gas supply unit 15, and is evaporated by the evaporator 22 to generate a Zr source gas, and the Zr source gas is supplied from the gas ejecting holes 24a into the process chamber 1 through the Zr source gas pipe 23 and the Zr source gas distribution nozzle 24 during a period T1. Accordingly, the Zr source is adsorbed onto the wafers. The period T1 ranges, for example, from 1 to 120 sec. Also, a flow rate of the Zr source ranges, for example, from 0.2 to 0.5 l/min. Also, a pressure inside the process chamber 1 at this time ranges, for example, from 10 to 100 Pa. Instead of TEMAZ, TDEAZ, which is liquid at room temperature like TEMAZ, may be appropriately used as the Zr source or another source that is solid at room temperature may be used as the Zr source as described above. Also, an inorganic compound may be used.

In the step S3 in which an oxidizing agent is supplied, an oxidizing agent, for example, an $O_3$ gas, is ejected from the oxidizing agent supply source 17 of the oxidizing agent supply unit 14 through the oxidizing agent pipe 18 and the oxidizing agent distribution nozzle 19. Accordingly, the Zr source adsorbed onto the wafers W is oxidized to form ZrO.

It is preferable that a period T3 of the step S3 ranges from 10 to 180 sec. Although a flow rate of the oxidizing agent varies according to the number of held wafers W or a type of the oxidizing agent, when an $O_3$ gas is used as the oxidizing agent and the number of held wafers W is from about 50 to about 100, the flow rate of the oxidizing agent ranges, for example, from 100 to 200 g/Nm$^3$. Also, a pressure inside the process chamber 1 at this time ranges, for example, from 10 to 100 Pa. Instead of an $O_3$ gas, a $H_2O$ gas, an $O_2$ gas, a $NO_2$ gas, a NO gas, a $N_2O$ gas, or the like may be used as the oxidizing agent as described above. Reactivity may be improved by installing a plasma generator and plasmatizing the oxidizing agent. Also, radical oxidation using an $O_2$ gas and a $H_2$ gas may be performed.

In each of the steps S2 and S4 for generating a desired reaction in a next process by removing a gas remaining in the process chamber 1 after the step S1 or the step S3, purging in the process chamber 1 is performed by supplying a purge gas, for example, $N_2$, into the process chamber 1 through the purge gas pipe 30 and the purge gas nozzle 31 from the purge gas supply source 29 of the purge gas supply unit 28. In this case, efficiency of removing a remaining gas may be improved by repeatedly performing vacuum suction and supply of a purge gas for a plurality of times. Periods T2 and T4 of the steps S2 and S4 range respectively, for example, from 20 to 120 sec. Also, a pressure inside the process chamber 1 at this time ranges, for example, from 10 to 100 Pa. At this time, in the step S2 after step S1 in which the Zr source gas is supplied and in the step S4 after the step S3 in which the oxidizing agent is supplied, since abilities which evacuate the gases in the steps S2 and S4 are different from each other, a vacuum suction time and a purge gas supply time may be changed. In detail, since a time taken to evacuate a gas after the step S1 is long, it is preferable that a time of the step S2 after the step S1 is longer than that of the step S4.

The step S11 of the second process is performed in almost the same manner as the step S1 of the first process. Also, in the step S13, a Si source, for example, 3DMAS, contained in the Si source chamber 25 of the Si source gas supply unit 16 is evaporated by the heater 25a and is supplied into the process chamber 1 from the gas ejecting holes 27a through the Si source gas pipe 26 and the Si source gas distribution nozzle 27 during a period T13. Accordingly, the Si source is adsorbed onto the wafers W. The period T13 ranges, for example, from 10 to 60 sec. Also, a flow rate of the Si source gas ranges, for example, from 50 to 300 ml/min. Also, a pressure inside the process chamber 1 at this time ranges, for example, from 10 to 100 Pa. Instead of 3DMAS, an organic compound, such as 4DMAS, BTBAS, or the like, may be used as the Si source as described above. Also, an inorganic compound, such as DCS, HCD, $SiH_4$, $Si_2H_6$, TCS, or the like, may be used. A Si concentration may be further reduced by using an inorganic compound.

The step S15 in which the oxidizing agent is supplied is performed in the same manner as the step S3. Also, the steps S12, S14, and S16 in which vacuum suction is performed and purging is performed in the process chamber 1 by supplying a purge gas are performed in the same manners as the steps S2 and S4. In the step S12 after the Zr source gas is supplied and the step S14 after the Si source gas is supplied, and the step S16 after the oxidizing agent is supplied, since abilities which evacuate the gases in the steps S12 and S14 and the step S16 are different from each other, a vacuum suction time and a purge gas supply time may be changed. In detail, since times taken to evacuate a gas in the steps S12 and S14 are longer than that in the step S16, it is preferable that a time of each of the steps S12 and S14 is longer than that of the step S16.

An experiment as a basis of the present invention will be explained.

Here, first, TEMAZ was used as a Zr source, 3DMAS was used as a Si source, $O_3$ was used as an oxidizing agent, and film formation was performed on a silicon wafer by using the film formation apparatus of FIG. 1 and the method shown in the chart of FIG. 3.

As shown in Table 1, zirconia-based films were formed by setting a total number of times x a first process for forming a ZrO film is performed to 51, and varying a number of times y a second process for forming a ZrO film (ZrSiO film) doped with Si is performed to change a Si concentration. And, the obtained films were annealed in a process chamber, in a $N_2$ atmosphere, at a pressure of 1 Torr (133.3 Pa), at a temperature of 450° C., for 30 minutes. A target film thickness was 7.0 nm.

In Table 1, a sample No. 1 is a comparative sample in which the second process is not performed and only the first process is performed (for convenience, a cycle defined by performing the first process 17 times is performed 3 times). In a sample No. 2, a cycle defined by performing the first process 17 times and performing the second process once is performed 2 times, and then the first process is performed 17 times. Accordingly, when the number of times x the first process is performed is 51, the number of times y the second process is performed is 2. In a sample No. 3, a cycle defined by performing the first process 10 times and performing the second process once is performed 4 times, and then the first process is performed 11 times. Accordingly, when the number of times x the first process is performed is 51, the number of times y the second process is performed is 4. In a sample No. 4, a cycle defined by performing the first process 7 times and performing the second process once is performed 6 times, and then the first process is performed 9 times. Accordingly, when the number of times x the first process is performed is 51, the number of times y the second process is performed is 6.

TABLE 1

| | | Cycle part | | | Additional part | | Total | | |
|---|---|---|---|---|---|---|---|---|---|
| No. | Target film thickness (nm) | First process ZrO x (number of times) | Second process ZrSiO y (number of times) | Number of cycles | First process ZrO x (number of times) | Second process ZrSiO y (number of times) | First process ZrO x (number of times) | Second process ZrSiO y (number of times) | Si Concentration (atm %) (RBS reduced value) |
| 1 | 7.0 | 17 | 0 | 3 | 0 | 0 | 51 | 0 | 0 |
| 2 | 7.0 | 17 | 1 | 2 | 17 | 0 | 51 | 2 | 0.04 |
| 3 | 7.0 | 10 | 1 | 4 | 11 | 0 | 51 | 4 | 0.08 |
| 4 | 7.0 | 7 | 1 | 6 | 9 | 0 | 51 | 6 | 0.13 |

Figure 5:
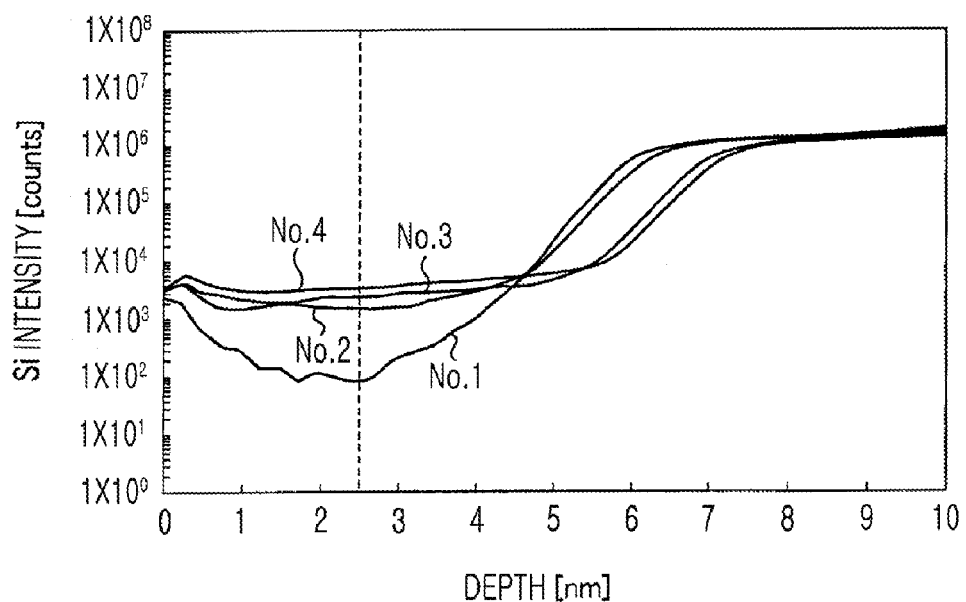
FIG. 5 is a graph showing a result obtained by measuring a Si intensity (counts) in a depth direction in a comparative sample and samples made based on the present invention by using secondary ion mass spectrometry (SIMS)
Figure 6:
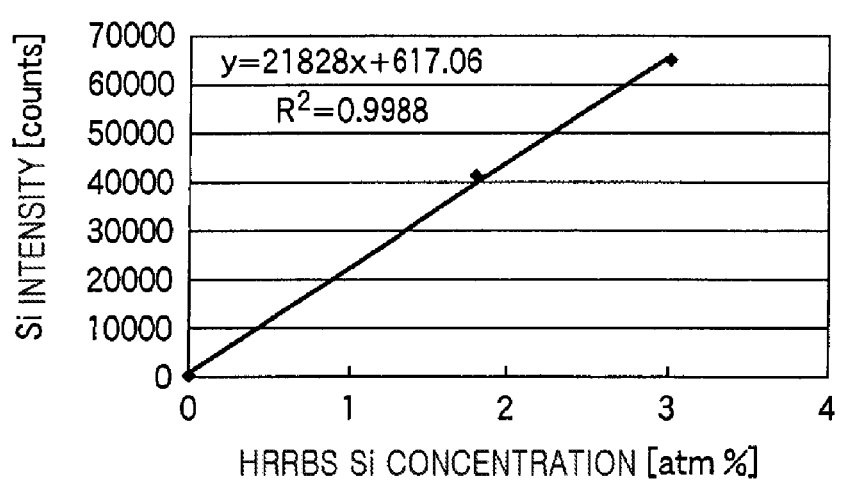
FIG. 6 is a graph showing a relationship between a Si concentration measured by using HRRBS and a Si intensity (counts) measured by using SIMS.

In the samples, a Si intensity (counts) in a depth direction was measured by using secondary ion mass spectrometry (SIMS). The result is shown in FIG. 5. It is found from FIG. 5 that Si exists in the films in the samples No. 2 through No. 4. A Si concentration in the films was measured by using Rutherford backscattering spectrometry (RBS). However, in this experiment, since Si is a small amount, it may be difficult to obtain an accurate Si concentration by using only RBS. Accordingly, as shown in FIG. 6, a Si concentration was obtained by making a calibration line from a Si intensity (counts) measured by using SIMS and Si concentrations (3.0 atm %, 1.8 atm %, and 0 atm %) measured by using high-resolution Rutherford backscattering spectrometry (HRRBS) and then obtaining an RBS reduced value from the calibration line. That is, since there is a very strong correlation between a Si concentration measured by using HRRBS and a Si intensity (counts) measured by using SIMS, a straight line almost penetrating a starting point as shown in FIG. 6 is obtained. Accordingly, since a Si concentration in a film is obtained by using the straight line as a calibration line from a Si intensity (counts) measured by using SIMS of FIG. 5, a Si concentration in a film can be more accurately obtained. When Si concentrations are measured as RBS reduced values by using the calibration line, the Si concentrations in the films are 0.04 atm % in the sample No. 2, 0.08 atm % in the sample No. 3, and 0.13 atm % in the sample No. 4. Accordingly, it has been found that a zirconium-based film doped with a small amount of Si can be formed by the present invention. Also, a Si intensity (counts) measured by using SIMS at this time was a Si intensity (counts) at a depth of 2.5 nm from a surface with high stability.

Next, electrical characteristics of zirconium-based films doped with various Si concentrations were measured.

Figure 7:
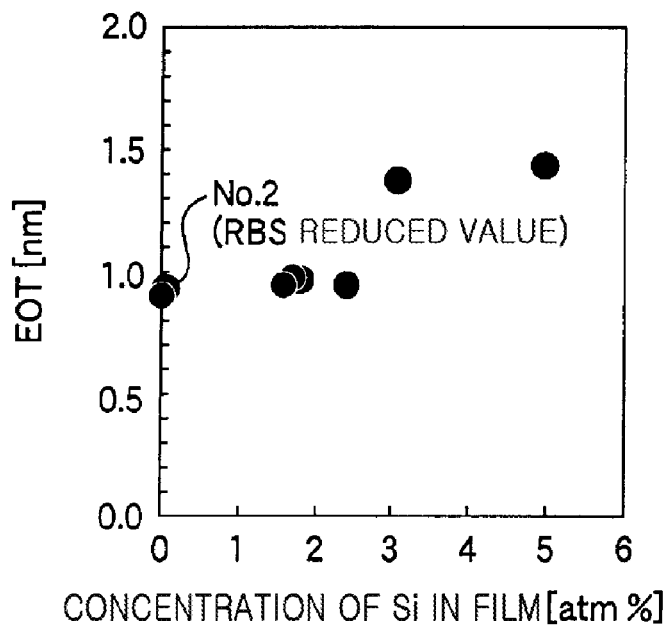
FIG. 7 is a graph showing a relationship between a Si concentration in a film and an EOT of the film.
Figure 8:
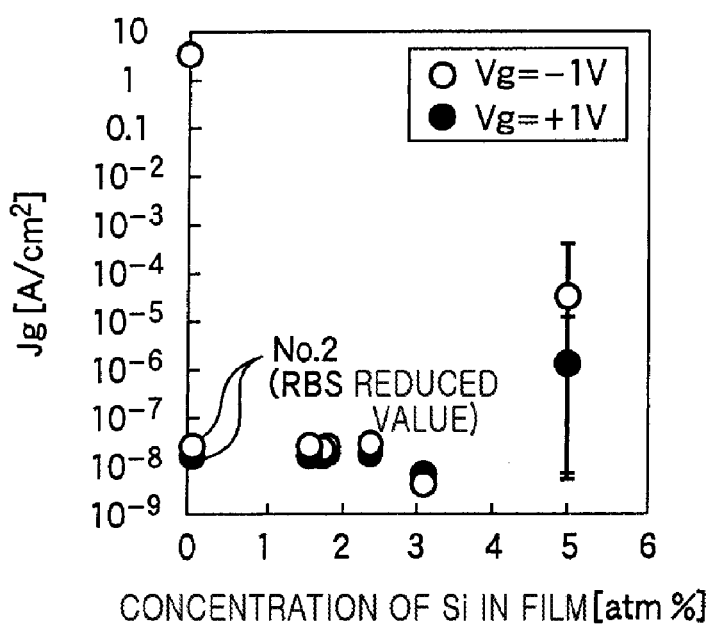
FIG. 8 is a view showing a relationship between a Si concentration in a film and a leakage current of the film.

FIG. 7 is a graph showing a relationship between a Si concentration in a film and an EOT in a flat capacitor of the film. FIG. 8 is a graph illustrating a relationship between a Si concentration in a film and a leakage current of the film. In FIGS. 7 and 8, a measurement value of the sample No. 1 (zirconia single film) and a measurement value of the sample No. 2 are shown, an RBS reduced value is used as a Si concentration of the sample No. 2, and a detection value measured by using HRRBS is used as a Si concentration for other plots. It has been found from FIGS. 7 and 8 that the zirconia-based film (No. 2) including a small amount of Si obtained by the method of the present invention has an EOT equal to that of a zirconia single film and has leakage current characteristics better than those of a zirconia single film. Also, it has been found that an EOT is increased when a Si concentration in the film is 3.0 atm %, and a leakage current is rather increased at about 5.0 atm %.

Also, the present invention is not limited to the above embodiments, and various modifications may be made. For example, although the present invention is applied to a batch type film formation apparatus in which film formation is collectively performed on a plurality of semiconductor wafers in the above embodiments, the present invention is not limited thereto, and the present invention may be applied to a single wafer type film formation apparatus in which film formation is performed on a single wafer at a time.

Also, although organic metal compounds are used as a Zr source and a Si source in the above embodiments, inorganic compounds may be used as described above. If an inorganic compound is used as the Si source, there is a merit that a Si concentration may be further reduced.

Also, if cyclopentadienyltris(dimethylamino)zirconium (MCPDTMZ), which is an organic metal compound that is liquid at room temperature, is used as a Zr source, cyclopentadienyltris(dimethylamino)zirconium (MCPDTMZ) has a good step coverage when compared to, for example, tetrakis (ethylmethylamino)zirconium (TEMAZ). That is, since a uniform film can be formed under a recessed portion, such thin film formation as that in TEMAZ rarely occurs. Accordingly, there is no risk that a Si concentration is increased to an extremely high level.

Also, when compared to TEMAZ, MCPDTMZ has reaction inhibition materials such as a cyclopenta group or the like. Accordingly, when an Si source is to be adsorbed, since an adsorption site is covered by the reaction inhibition materials, it is difficult to adsorb the Si source. Accordingly, the Si source can be controlled in smaller amounts.

Also, if an organic metal compound that is liquid at room temperature is supplied as a Zr source, an ampoule type evaporator may be used. The ampoule type evaporator evaporates a liquid material contained in an ampoule (chamber) by using a vapor pressure of the material. For example, the liquid material is evaporated by reducing a pressure inside the ampoule, or by reducing a pressure inside the ampoule and heating the liquid material in the ampoule, and the evaporated liquid material is supplied into the process chamber 1 along with a carrier gas, for example, an Ar gas or the like. Since such an ampoule type evaporator evaporates a liquid material in an ampoule, when compared to an evaporator that supplies a liquid to a heated metal and uses a vapor of the liquid, an amount of generated particles is reduced. The ampoule type evaporator is particularly appropriate when MCPDTMZ is selected as a Zr source.

In addition, although a Si concentration is suppressed by adjusting a number of times a first process is performed and a number of times a second process is performed in the embodiments, a Si concentration may be suppressed by adjusting a flow rate of the Si source in the second process.

Furthermore, an object to be processed is not limited to a semiconductor wafer, and may be any of various substrates, such as an LCD glass substrate and the like.

According to the present invention, a first process for forming a ZrO film on an object to be processed by supplying a zirconium material and an oxidizing agent in the order listed above into a process chamber and a second process for forming a ZrO film doped with Si on the object to be processed by supplying the zirconium material, a silicon material, and the oxidizing agent in the order listed above into the process chamber are performed in such a way that a number of times the first process is performed and a number of times the second process is performed, respectively. Accordingly, since Si is not contained in the first process and an amount of adsorbed Si is reduced by adsorbing the zirconium material and then the silicon material in the second process, a Si concentration in a film may be reduced greatly by adjusting the number of times the first process is performed and the number of times the second process is performed. Accordingly, when film formation is performed on a recessed and protruded portion, since an average Si concentration may be a value which prevents a dielectric constant from being reduced and prevents leakage current characteristics from being deteriorated even though a Si concentration is locally increased in a recessed portion, a zirconia-based film, that can maintain the crystallinity of $ZrO_2$ can be formed even on the recessed and protruded portion without reducing a dielectric constant and deteriorating leakage current characteristics.

What is claimed is:

1. A film formation method, wherein an object to be processed is transferred into a process chamber capable of keeping a vacuum, comprising:

forming a first ZrO film on the object by supplying a first zirconium material and a first oxidizing agent in the order listed above into the process chamber, forming a second ZrO film doped with Si on the object by supplying a second zirconium material, a silicon material, and a second oxidizing agent in the order listed above into the process chamber; and repeating the forming of the first ZrO film in a number of times x and the forming of the second ZrO film in a number of times y to thereby form a zirconia-based film having a predetermined film thickness, wherein a Si concentration in the zirconia-based film is controlled by adjusting the number of times x and the number of times y.

2. The film formation method of claim 1, wherein the Si concentration in the zirconia-based film is controlled to be equal to or lower than 1.0 atm %.

3. The film formation method of claim 1, further comprising evacuating a gas remaining in the process chamber between the supply of the first zirconium material and the supply of the first oxidizing agent, between the supply of the silicon material and the supply of the second oxidizing agent, and between the supply of the second zirconium material and the supply of the silicon material.

4. The film formation method of claim 1, further comprising annealing the zirconia-based film at a temperature of 450° C. or lower after the zirconia-based film is formed.

5. The film formation method of claim 1, wherein the first and second zirconium materials are one selected from the group consisting of tetrakis(ethylmethylamino)zirconium (TEMAZ), tetrakis(diethylamino)zirconium (TDEAZ), and cyclopentadienyltris(dimethylamino)zirconium (MCP-DTMZ).

6. The film formation method of claim 5, wherein when the zirconium materials are evaporated, the zirconium materials are evaporated by using a vapor pressure of the zirconium materials.

7. The film formation method of claim 1, wherein the silicon material is one selected from the group consisting of tri(dimethylamino)silane (3DMAS), tetra(dimethylamino)silane (4DMAS), bis(tertiary butylamino)silane (BTBAS), dichlorosilane (DCS), hexachlorodisilane (HCD), monosilane ($SiH_4$), disilane ($Si_2H_6$), and tetrachlorosilane (TCS).

8. The film formation method of claim 1, wherein the first and second oxidizing agents are at least one selected from the group consisting of an $O_3$ gas, a $H_2O$ gas, an $O_2$ gas, a $NO_2$ gas, a NO gas, a $N_2O$ gas, and radicals of an $O_2$ gas and a $H_2$ gas.

* * * * *